US009472431B2

(12) United States Patent
Gregerson et al.

(10) Patent No.: US 9,472,431 B2
(45) Date of Patent: Oct. 18, 2016

(54) THIN WAFER SHIPPER

(75) Inventors: Barry Gregerson, Deephaven, MN (US); Jason Steffens, Shakopee, MN (US); Russ V. Raschke, Chanhassen, MN (US)

(73) Assignee: ENTEGRIS, INC., Billerica, MA (US)

( * ) Notice: Subject to any disclaimer, the term of this patent is extended or adjusted under 35 U.S.C. 154(b) by 356 days.

(21) Appl. No.: 13/583,886

(22) PCT Filed: Mar. 11, 2011

(86) PCT No.: PCT/US2011/028243
§ 371 (c)(1),
(2), (4) Date: Nov. 16, 2012

(87) PCT Pub. No.: WO2011/113033
PCT Pub. Date: Sep. 15, 2011

(65) Prior Publication Data
US 2013/0056389 A1    Mar. 7, 2013

Related U.S. Application Data

(60) Provisional application No. 61/312,718, filed on Mar. 11, 2010.

(51) Int. Cl.
*H01L 21/673* (2006.01)
*H01L 21/67* (2006.01)

(52) U.S. Cl.
CPC ... *H01L 21/67369* (2013.01); *H01L 21/67383* (2013.01); *H01L 21/67386* (2013.01)

(58) Field of Classification Search
CPC .............. H01L 21/67369; H01L 21/6732; H01L 21/67326; H01L 21/67383; H01L 21/67373; H01L 21/67386; B29C 45/16; B65D 25/107; Y10S 206/832

USPC ............... 206/710–702, 454, 832, 587, 711
See application file for complete search history.

(56) References Cited

U.S. PATENT DOCUMENTS 4,061,228 A    12/1977 Johnson
4,718,549 A *   1/1988 Rissotti et al. ............... 206/711
(Continued)

FOREIGN PATENT DOCUMENTS

CN    1475416 A         2/2004
JP    H02106831 (U)     8/1990
(Continued)

*Primary Examiner* — Chun Cheung
(74) *Attorney, Agent, or Firm* — Wilmer Cutler Pickering Hale and Dorr LLP

(57) ABSTRACT

An improved wafer support mechanism in a wafer container useful for carrying a plurality of axially aligned thin mostly circular wafer substrates. The container includes a cassette that has a plurality of adjacently disposed teeth for receiving the substrates, wherein each rib member is continuous from the cassette open top to the cassette open bottom, a removable top cover portion, a removable bottom cover portion, a cushion assembly removably attached to the container top cover and another cushion assembly removably located in the container bottom cover and held in place by the weight of the wafer cassette. The top cushions are formed of individual segments having an extended lead-in feature at the end of each segment, spring sections in each segment and each segment has a V-shaped cross section to receive the wafer edge. The top and bottom cushions are installed in the top and bottom container covers respectively, and extend the wafer support to approximately the entire circumference of each wafer.

25 Claims, 7 Drawing Sheets

(56) References Cited

U.S. PATENT DOCUMENTS

| | | |
|---|---|---|
| 4,793,488 A | 12/1988 | Gregerson |
| 4,949,848 A | 8/1990 | Kos |
| 4,966,284 A | 10/1990 | Gregerson et al. |
| 5,011,041 A | 4/1991 | Kakizaki |
| 5,207,324 A | 5/1993 | Kos |
| 5,228,568 A * | 7/1993 | Ogino et al. ............... 206/711 |
| 5,255,797 A | 10/1993 | Kos |
| 5,273,159 A | 12/1993 | Gregerson |
| 5,555,981 A * | 9/1996 | Gregerson ................... 206/711 |
| 5,586,658 A | 12/1996 | Nyseth |
| 5,782,362 A | 7/1998 | Ohori |
| 6,039,186 A * | 3/2000 | Bhatt et al. ................. 206/711 |
| 7,017,749 B2 * | 3/2006 | Yajima et al. ............... 206/711 |
| 8,118,169 B2 | 2/2012 | Hosoi et al. |
| 2003/0221985 A1 | 12/2003 | Yajima et al. |
| 2005/0274645 A1 | 12/2005 | Hasegawa et al. |
| 2007/0193907 A1 * | 8/2007 | Bhatt et al. ................. 206/449 |
| 2010/0258475 A1 | 10/2010 | Ogawa |

FOREIGN PATENT DOCUMENTS

| | | |
|---|---|---|
| JP | H06-079152 | 11/1994 |
| JP | 2004-158808 A | 6/2004 |
| WO | WO 2007/146936 A2 | 12/2007 |

* cited by examiner

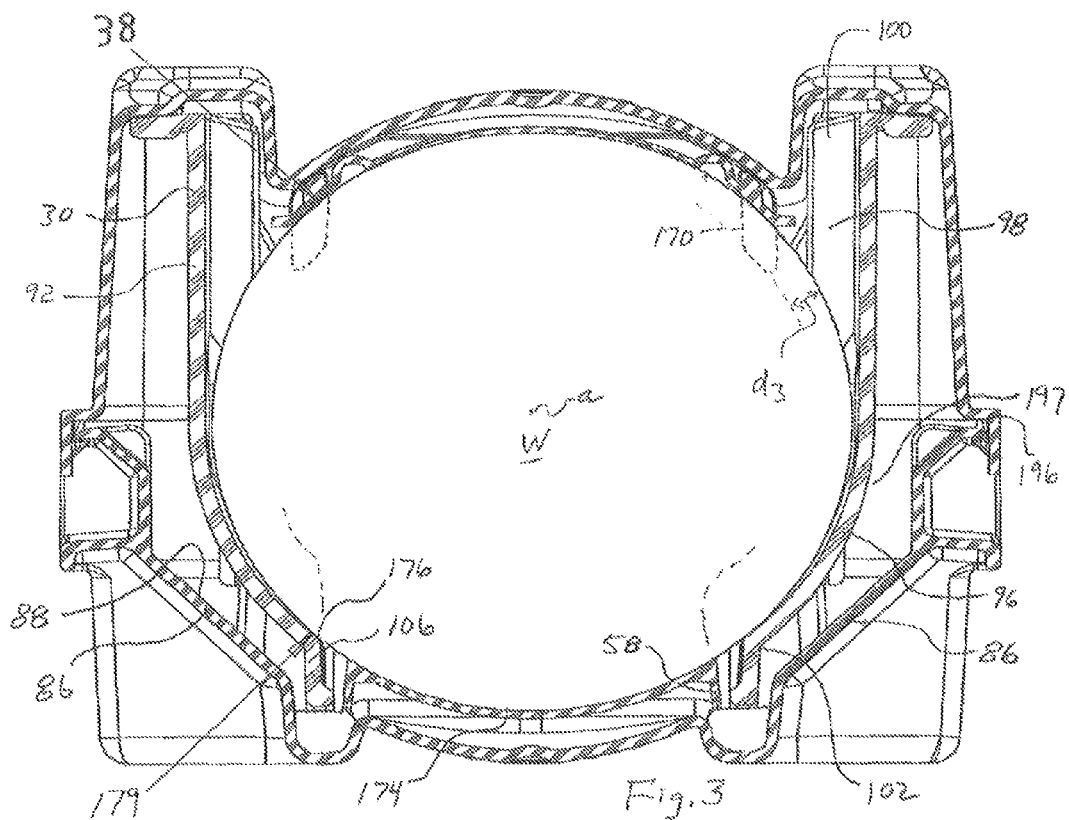
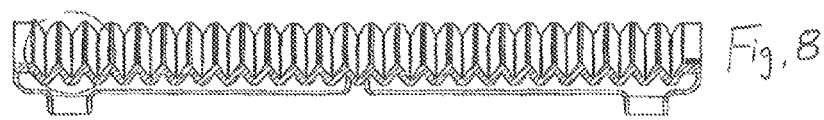
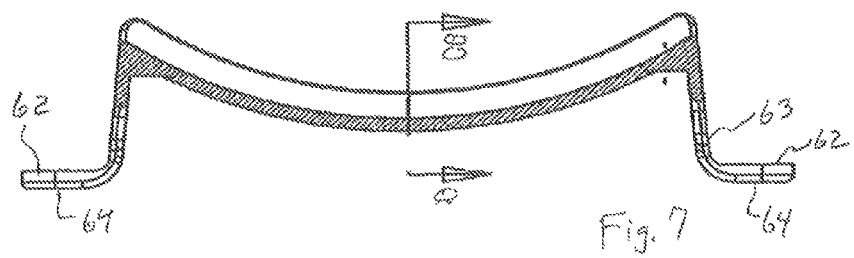

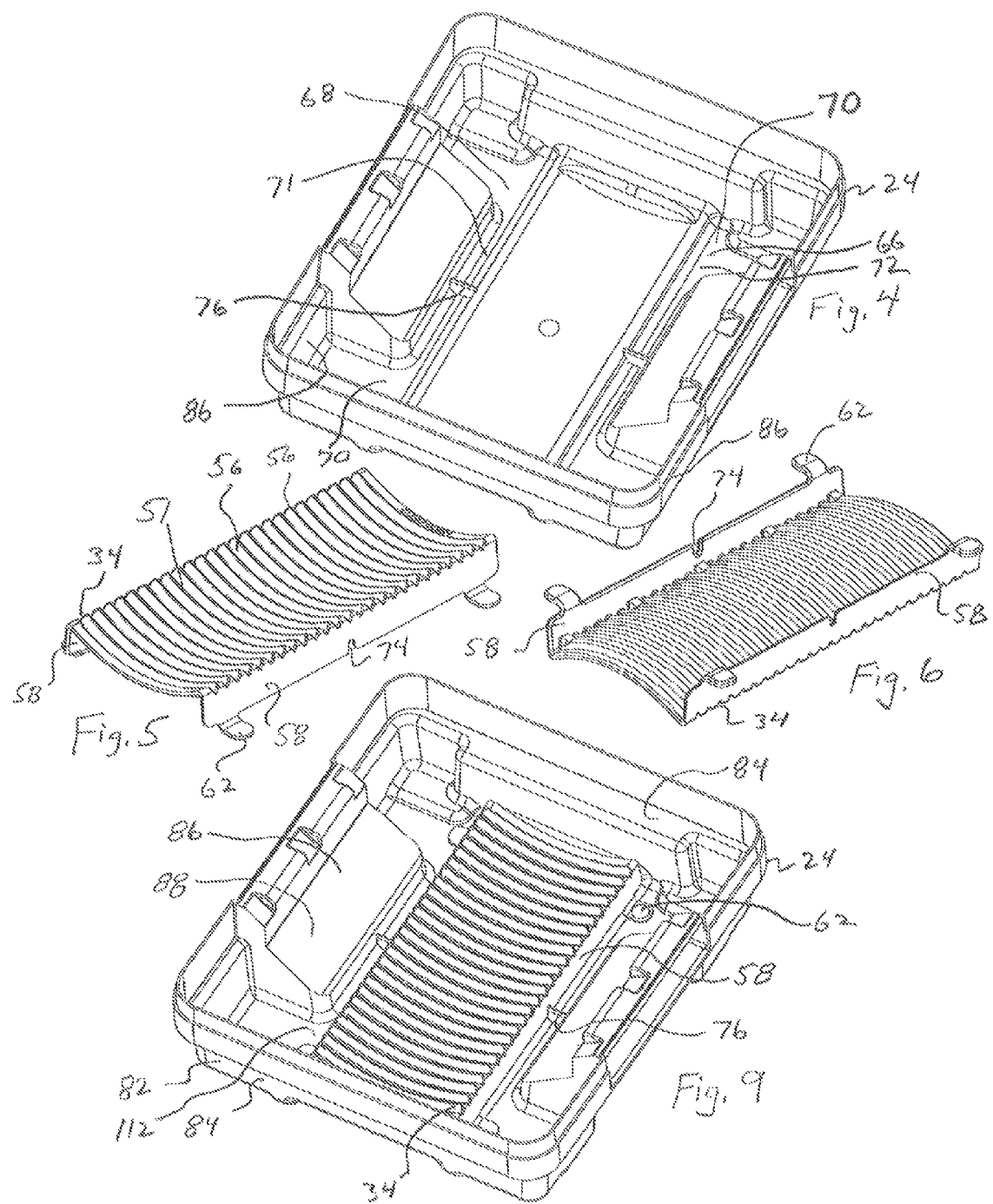

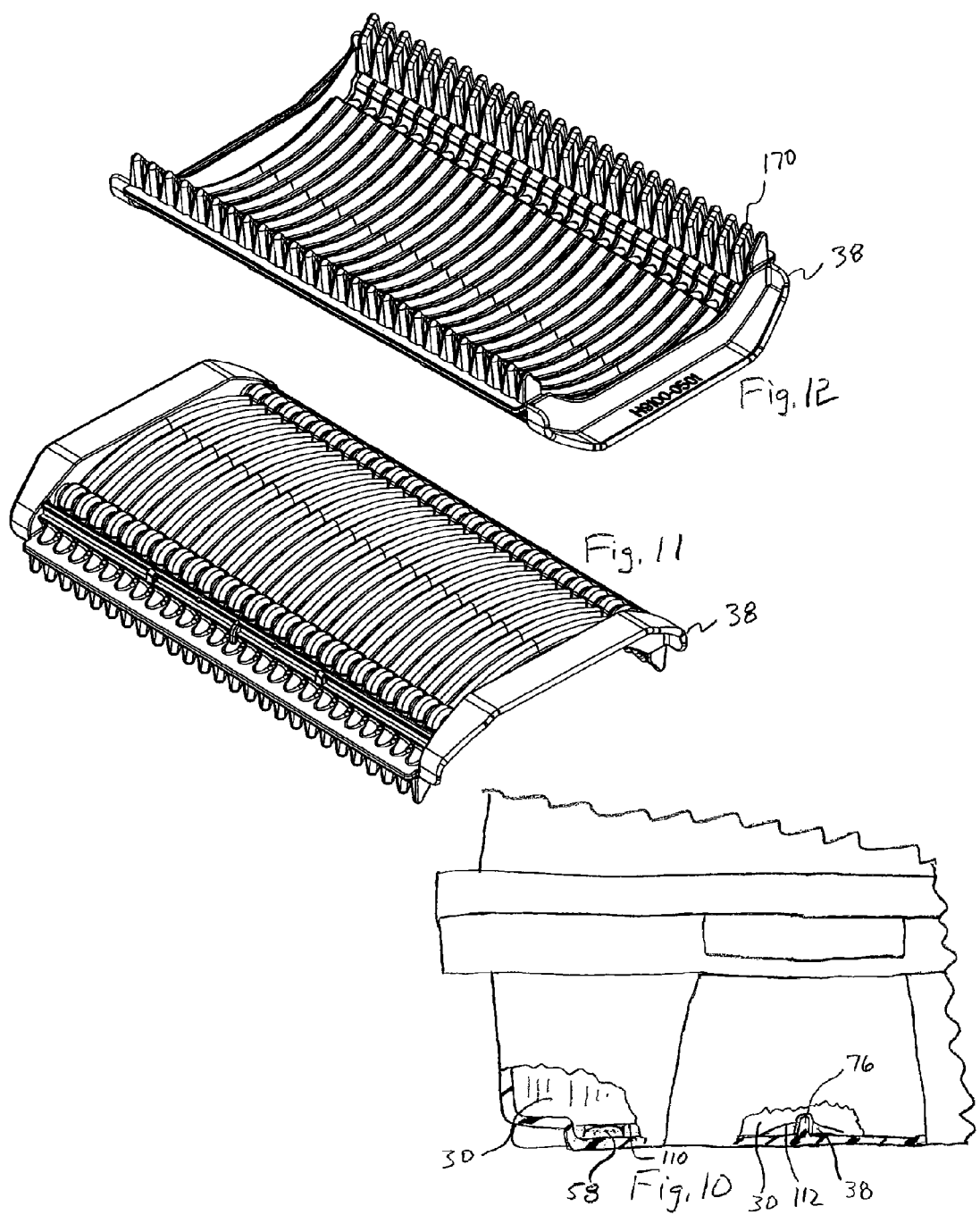

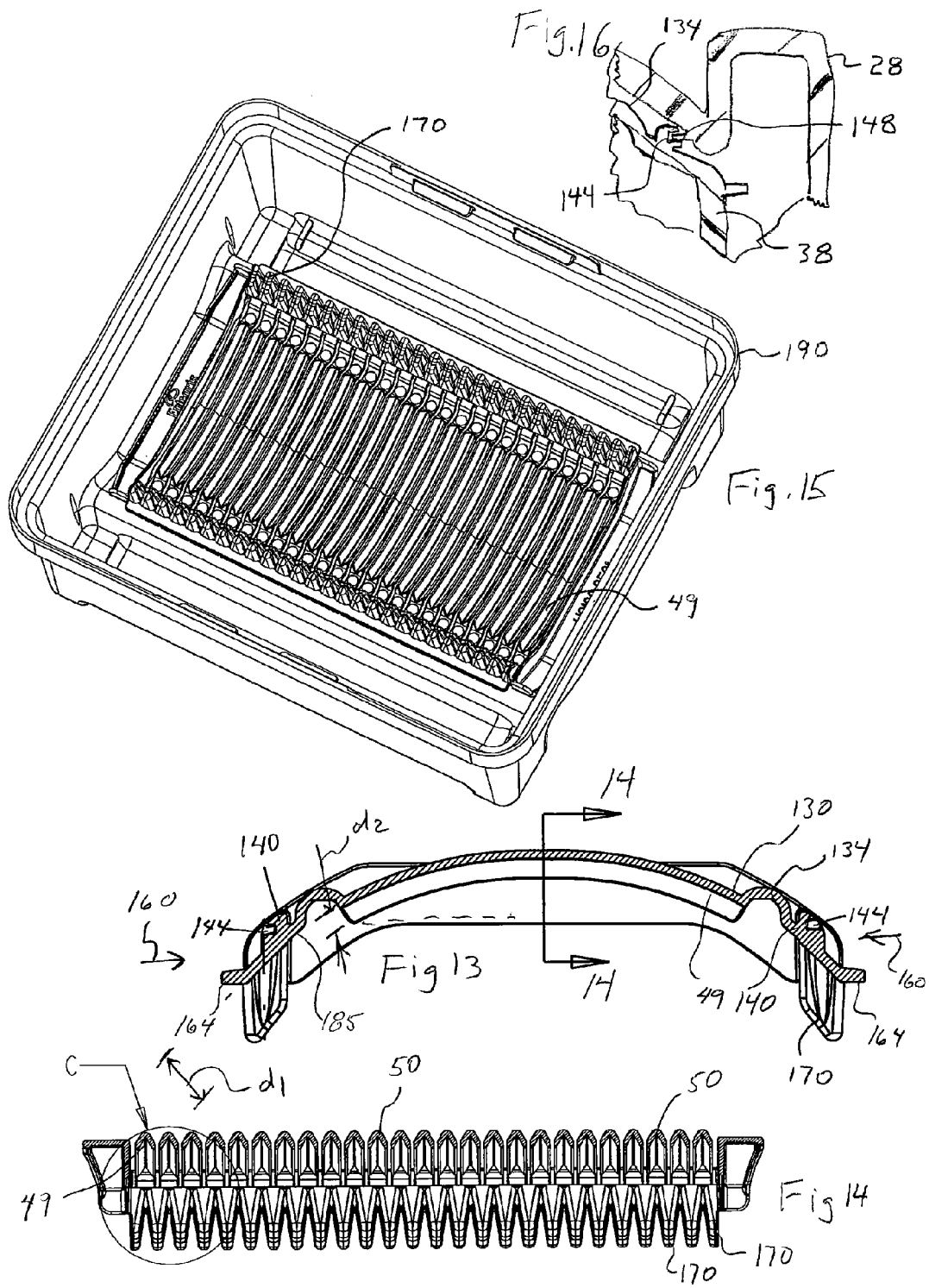

THIN WAFER SHIPPER

RELATED APPLICATIONS

Priority Claim

The present application is a National Phase entry of PCT Application No. PCT/US2011/028243, filed Mar. 11, 2010, which claims priority from U.S. Provisional Application No. 61/312,718, filed Mar. 11, 2010, the disclosures of which are hereby incorporated by reference herein in their entirety.

TECHNICAL FIELD OF THE INVENTION

The present invention relates generally to containers for carrying substrates and semiconductor wafers, and the like. More particularly, the present invention relates to an improved wafer support mechanism in a wafer container useful for carrying a plurality of axially aligned thin mostly circular wafer substrates. The container includes a cassette that has a plurality of adjacently disposed rib members for receiving the substrates, wherein each rib member is continuous from the cassette open top to the cassette open bottom, a removable top cover portion, a removable bottom cover portion, a cushion assembly removably attached to the container top cover and another cushion assembly removably located in the container bottom cover and held in place by the weight of the wafer cassette.

BACKGROUND OF THE INVENTION

For years, manufacturers have produced special containers for transporting and storing substrates and semiconductor wafers, and the like. Due to the delicate nature of the wafers and their extreme value, it is vital that they are properly protected throughout the transportation process. Since the handling of wafers is generally automated, it is necessary for wafers to be precisely positioned relative to the handling equipment for the robotic removal and insertion.

In addition to protection from damage by breakage, always in shipping storing or processing semiconductor wafers, cleanliness and contamination control is critical. The components and materials utilized must be very clean in the sense of not shedding or minimal shedding of particles and not exuding contaminants, such as gases, that can form film layers on the wafers. The containers and components are typically reused and must be amenable to cleaning and must be able to withstand repeated washing and drying cycles. Additionally, it is also critical, due to the commodity nature of wafer containers, particularly shippers for 100 mm and 150 mm wafers, that the containers are inexpensively manufactured and inexpensively maintained, such as replacement of component parts.

Conventional wafer shippers, particularly for 100 mm and 150 mm wafers comprise a wafer cassette, which holds a plurality of semiconductor wafers, contained in a wafer cassette container. The combination protects the wafers from mechanical damage and contamination during the storage and transportation. See for example, U.S. Pat. Nos. 4,949, 848; 4,966,284; 4,793,488; and 5,273,159 for exemplary prior art wafer shippers. These patents are owned by the owner of the instant invention and are incorporated by reference herein.

The conventional wafer cassette is a single molded part generally comprising a front end having an H-bar machine interface portion, a back end having a panel, and sidewalls having slots comprising lower curved or converging portions following the curvature of the wafers, and with an open top and open bottom such as the device disclosed in U.S. Pat. No. 5,782,362 hereby fully incorporated herein by reference. See element no. 1 in FIG. 12 of said reference. Also see U.S. Pat. No. 4,949,848 owned by the owner of the instant invention. The open bottom of such cassettes are defined by the side walls that extend downwardly from the converging portions in a parallel and vertical arrangement, and by the feet that extend downward from the sidewalls. The feet are generally planar, parallel, and with parallel edge surfaces upon which the carrier rests when it is seated with the open top upward. The edge surfaces will typically have an industry standard locating notch for engaging with a cooperating rib on a seating surface for proper positioning and forward rearward securement.

Such conventional cassettes generally have standardized dimensions, features, and configurations so as to be relatively interchangeable and useable with robotic processing equipment from a variety of manufacturers. This includes the H-bar and the parallel elongate feet with the notches. Additionally, for example, the "pitch", or distance between the same surface of wafers stored in adjacent slots, is typically 0.1875 inch, while the depth of the slot at each sidewall is typically 0.440 inch.

The wafer cassette container or container portion of the shipper includes a lower base portion and a separate top cover portion having cushioning features for protecting the wafers during shipment. Some shippers, designed typically for 200 mm wafers or larger, include a bottom cushion secured to the base portion, see U.S. Pat. No. 5,273,159, for example. The cassette may conventionally be loaded robotically using the cassette oriented such that the H-bar side is positioned at the bottom of the cassette. The H-bar then functions as a machine interface to properly seat the cassette on an equipment surface so that wafers may be robotically inserted with the wafers in a horizontal plane into the open front of the cassette. The loaded cassette is then rotated 90 degrees such that the wafers are in a vertical plane and the loaded cassette is placed into the lower base portion of the wafer carrier container. Such conventional wafer carrier containers may have a location ribs in the bottom at a seating surface to cooperate with the locating notches on one or both of the feet to properly orient and seat the cassette.

Recently, the semiconductor industry has begun using wafers having a very thin cross sectional dimension. The thickness of these thin silicon wafers can be as thin as 200 um, in contrast with a typical conventional SEMI standard wafer thickness. Also, a thin germanium wafer thickness can be 125 um. Thin wafers present unique design considerations, and cassette style shippers are unsatisfactory in several respects for use with the thinner wafers. Thin wafers can be considered any wafer thickness that is less than the SEMI standard nominal thickness for wafers which is shown in the following table.

| Wafer Standard Diameter | Wafer Standard Thickness |
| --- | --- |
| 100 mm | 525 um |
| 125 mm | 625 um |
| 150 mm | 675 um |
| 200 mm | 725 um |
| 300 mm | 775 um |
| 450 mm | 925 um |

Another characteristic of thin wafers is that they can be substantially more fragile and prone to physical damage than a standard wafer. A conventional wafer carrier having limited support for the wafer around the extreme periphery of the wafer, causes increased stresses during shock events. The stress created makes the wafer even more prone to physical damage from shock or vibration.

The edges of thin wafers can be very sharp, and are formed from very hard materials, like silicon and germanium. These sharp edges can get caught on the cushion when the cover is installed causing cross-slotting and potentially causing damage to the wafer. Additionally, thin wafers may cut through softer materials that come into contact with the peripheral edge of the wafer, for example the wafer carrier plastic material.

Although existing containers are designed to reduce the effects of physical shock which can damage thin and fragile wafers, wafer containers are needed with improved shock reducing properties. There is a need for a wafer carrier specifically designed to be suitable for use with very thin wafers, in particular to accommodate their increased fragility while maintaining low manufacturing cost.

SUMMARY OF THE INVENTION

The invention as depicted is an embodiment of an improved wafer container for use in transporting, storing or processing thin data semiconductor wafers or other thin substrates. The present invention comprises generally a cassette portion and a container portion. The cassette portion wafer cassette is a single molded part generally comprising a front end having an H-bar machine interface portion, a back end having a panel, and sidewalls having slots comprising lower curved or converging portions following the curvature of the wafers, and with an open top and open. Parallel feet portions extend downwardly from the bottoms of the converging portions and present feet edge surfaces.

This cassette is placed into a two-piece container portion for transport. This container portion comprises a top cover which attaches to a bottom cover. The top and bottom covers also include a cushion assembly which is designed to ensure that the wafers do not cross-slot and that they are sufficiently held in place during transportation to avoid damage. The top cover wafer retaining cushion assembly is removable and is formed so that it contacts the edge periphery of the wafer from the top of the side wall ribs on one side of the cassette to the top of the side wall ribs on the opposite side of the cassette. This upper cushion includes spring features, configured as U-shaped sections, on each rib section near each side of the cushion assembly that provide controlled compressive force to the wafers to prevent wafer rotation during transit and shipping. This upper cushion also contains an extended tooth guide-in portion segment, configured as a prong, on the end of each rib section at the sides of the cushion assembly. Upon placement of the top cover onto the base portion the wafer edges first encounter and possibly engage the wafer guides to prevent the wafers from cross-slotting. Wafer cross-slotting is defined as the condition where a wafer locates in a top cushion and in the adjacent lower cushion of between cushion segments. The bottom cover also includes a removable wafer retaining cushion assembly. This cushion assembly is formed so that it contacts the edge periphery of the wafer from the bottom of the side wall ribs on one side of the cassette to the bottom of the side wall ribs on the opposite side of the cassette. The bottom cushion may simply of the side wall ribs on the opposite side of the cassette. The bottom cushion may simply sit in a conforming region in the bottom of the cassette without being secured therein other than by gravity, that is, the bottom cushion may be constrained only by gravity from upward linear vertical movement. The bottom cushion has rails extending in an axial direction from which the arcuate wafer cushion segments are suspended. The bottom cushion rails may have pads extending laterally and that contact the upward seating surface of the base portion. The feet of the cassette portion may seat on these pads such that the pads are sandwiched between base portion and cassette portion.

The result of the side wall ribs together with the top and bottom cover cushion assemblies is to support each wafer in the container on a larger portion of the circumference of the wafer thereby reducing the stress points created where the previous wafer cushions contacted the wafer edge. The wafer is suspended away from the slots in the sidewalls when enclosed in the container portion. However, the gap may be 0.005-0.015 inches and may permit contact with the sidewalls at the grooves when under an impact condition.

An advantage of embodiments of the invention is that the cassette, the top cover, the bottom cover, the two wafer cushions may be formed of the same polymer material, such as polypropylene. This makes identifying contamination issues associated with wafers carried in the container much easier as there is only one material to investigate as the possible contaminant source with respect to the shipper.

An advantage of an embodiment of the present invention is a wafer container for carrying a plurality of axially aligned thin semiconductor wafers. The container has a cassette portion with side wafer supports that cooperate with the cushion assemblies in the top and bottom cover to support thin wafers for short term storage and transportation.

Another advantage of an embodiment is the cushion design includes a spring mechanism that provides compressive force to the wafers to prevent rotation during transit/shipping Another advantage of an embodiment is the cushion design includes an alignment feature at the edges of the upper cushion to prevent wafer cross-slotting.

Another advantage of embodiments of the invention is that the lower cushion is seated in the bottom by simply placing the cushion therein in a conforming recess. Additionally in embodiments, the cushion has a pair of horizontal rails extending in an axial direction with respect to the wafers, with a plurality of wafer cushion segments extending therebetween. The rails may have pads extend therefrom that are sandwiched between the wafer cassette portion feet and the base portion. Thus the lower wafer cushion, in certain embodiments, provides direct engagement and cushioning to the wafers as well as providing cushioning the cassette portion.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 3 is a cross section view of the wafer shipper of FIG. 1 according to the invention herein.

FIG. 4 is a top perspective view of the base portion of the shipper of FIG. 3.

FIG. 5 is a top perspective view of the lower wafer cushion to be seated in the base portion.

FIG. 6 is a perspective view of the bottom side of the wafer cushion of FIG. 5.

FIG. 7 is a cross sectional view of the wafer cushion of FIGS. 5 and 6.

FIG. 8 is a cross sectional view taken at line 8-8 of FIG. 7.

FIG. 9 is a top perspective view of the base portion with the wafer cushion seated therein.

FIG. 10 is a front elevational view of the assembled shipper with portions broken away to disclose the pad of the wafer cushion sandwiched between the base portion and the wafer cassette foot.

FIG. 11 is a top perspective view of a wafer cushion suitable for the top cover and in accord with the invention herein.

FIG. 12 is a bottom perspective view of the wafer cushion of FIG. 11.

FIG. 13 is a cross sectional view through the wafer cushion of FIGS. 11 and 12.

FIG. 14 is a cross sectional view taken at line 14-14 of FIG. 13.

FIG. 15 is a perspective view of the inside of the top portion of the container portion with a cushion therein.

FIG. 16 is a cross sectional detail showing the attachment structure of the wafer cushion and the top cover portion of FIG. 15.

DETAILED DESCRIPTION OF THE INVENTION

Figure 1:
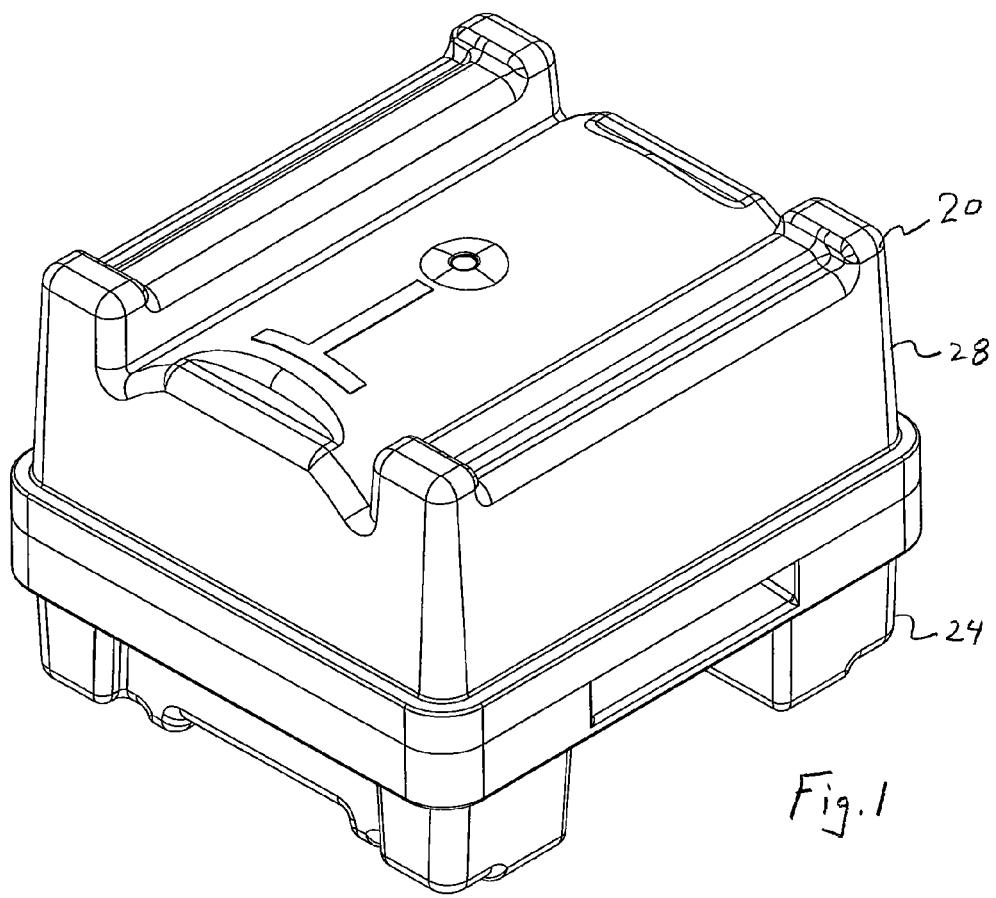
FIG. 1 is a perspective view of a wafer shipper according to the invention herein.
Figure 2:
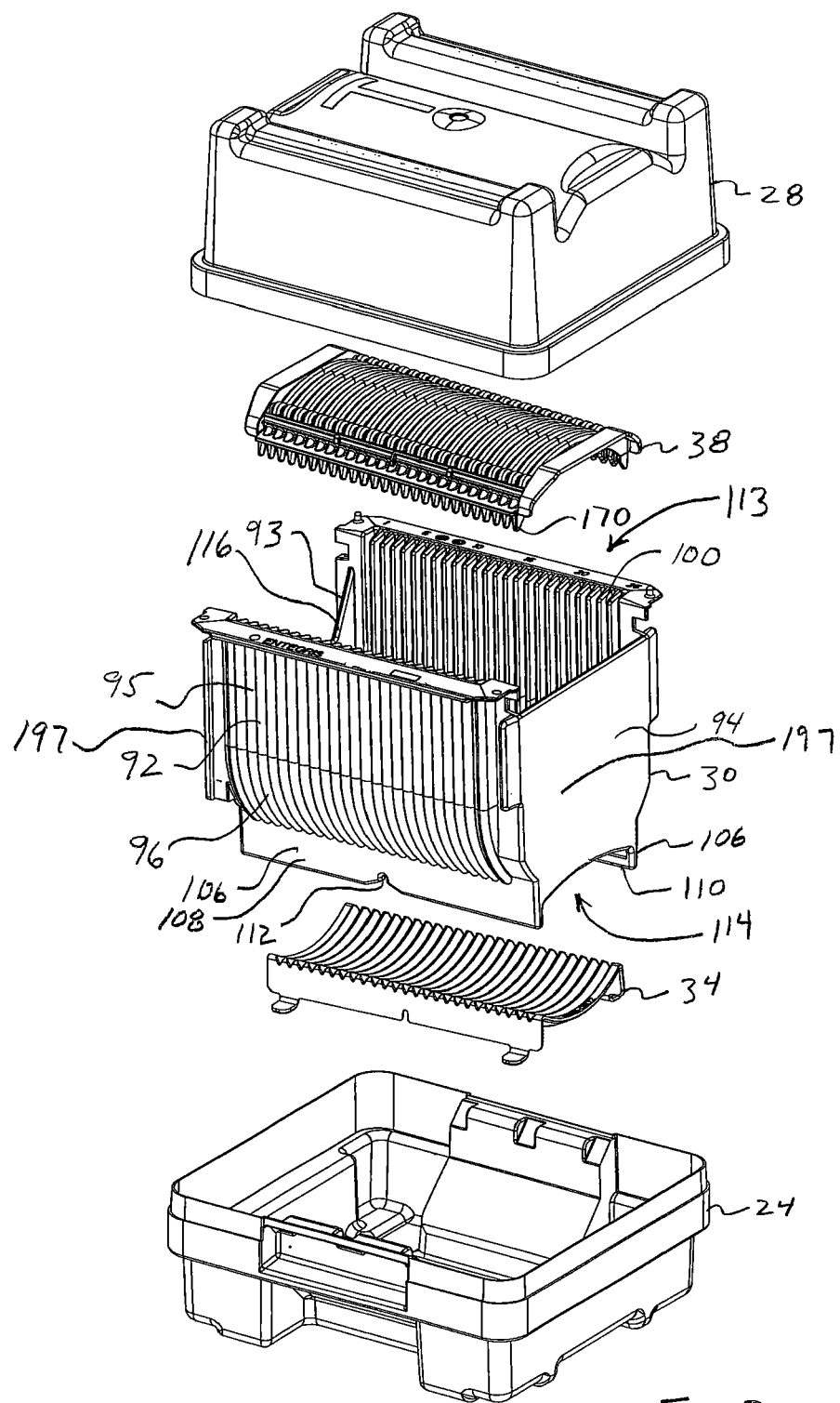
FIG. 2 is an exploded view of a wafer shipper according to the invention herein.

Referring to FIGS. 1 and 2, a wafer shipper 20 according to embodiments of the invention is illustrated and is comprised generally of a container portion 22 comprising a base portion 24, a top cover portion 28, a cassette 30, a lower cushion 34, and an upper cushion 38.

The present invention provides for the substrate cushion assemblies to be mounted in the cover portion 28 and the base portion 24 of the wafer container portion 22. These cushion assemblies provide additional support to the wafer W during transportation to minimize wafer damage from shock and vibration and rotation without adding additional secondary packaging. When the container top cover is installed, the additional wafer cushion assemblies also are able to guide the wafers into the optimum seating position inside the cassette to reduce the risk of the wafers cross-slotting during the loading operation and transit. The upper and lower peripheries of the wafers are in contact with center lines of respective V shaped grooves 49 in the upper cushion segments 50 and the V shaped groove 40 in the lower cushion segment so that each of the wafers is kept apart from its neighbor wafer, thus reducing the contact of wafers, thereby minimizing contamination of the wafer surface. Further, the elastic resilience of the cushion assembly serves to ensure correct positioning of the wafers when the upper periphery of the wafers contacts the cushion, the elastic cushion is bent archwise to effect movement of the periphery of the wafer into the center line of the V-shaped grooves 49, 40. The elastic resilience of the cushion assembly exhibits a damping effect to the vibrations and mechanical shocks on the wafers during transportation of the wafer container so that the wafer contained therein can be protected from damage. Existing cushion technology demonstrates wafer damage at a force of 25 g, in a 38 inch free-fall drop and testing of the present invention cushion assemblies indicates wafer damage at a force of between 46 g and 51 g in a 38 inch free-fall drop.

Referring to FIGS. 3-10, details of the bottom base portion 24 of the container portion 22 and the wafer cushion are illustrated. The container has an axial direction consistent with the axis a of wafers in place in the cassette that is placed in the container. In this embodiment, the wafer cushion is configured as a panel, that it, there is not separation between individual wafer engagement portions or segments 56. The cushion has a pair of rails 58 that provide structural support for the arcuate wafer engagement portions 56. Extending from the lower edge portion 58 of the rails are tabs or pads 62 with leg portions 63. The pads have a bottom surface 64 that contacts the seating surface 66 of the bottom floor 68 of the base portion 24. The bottom floor of the base portion has a cushion receiving area 70, configured as an axially extending gutter 71, which conforms to the cushion and particularly the rails of the cushion. That is, recessed areas 72 allow the cushion to be essentially dropped into place and it properly seats. The rails also have notches 74 that further cooperate with locating ribs 76 recessed area of the base portion. The rails further facilitate the very easy placement of the cushion. Notably there is no further operation in installing the bottom cushion other that dropping it in place.

Also, the bottom portion has a four walls 82 with two end walls 84 and two side walls defining the enclosure. Two angled or inclined wall portions 86 with inclined surfaces 88 that further aid in guiding the bottom cushion into proper seating position.

The base portion also receives and is conformingly shaped for the cassette 30. The cassette has a pair of sidewalls 92 connected with end walls 93 and 94. The sidewalls have vertical upper portions 95 and converging lower portions 96 and ribs or teeth 98 that define slots 100. Extending downwardly from the bottom edge 102 of the converging wall portions are a pair of feet 106 with edge portion 108 and edge surfaces 110. The feet have locating notches 112. The cassette sits on the feet when the open top is oriented upwardly. The cassette has an open top 113 and an open bottom 114. Often for robotically loading and unloading such cassettes, the cassette will be rotated forward 90 degrees and rest on the conventional H-bar 116 such that wafers may be loaded and unloaded horizontally.

The recessed area 70 and the inclined surfaces 88 further provide guidance for the feet of the cassette 30 when lowered into the base portion. The cassette is placed in the base portion after the lower cushion 34 is placed therein. The feet are guided into the cassette receiving region 116 which is in the gutter 71 laterally outside of the rails of the cushion. The lower edges, in certain embodiments, rather that seat on the surface of the floor, seat on the pads 62 of the lower cushion as best illustrated in FIG. 10. The pads are sandwiched between the cassette and base portion provide stability and also providing the cassette with enhanced shock absorption due to the additional layer and thickness of polymer.

Moreover, the cassette as well as the cushion as described above, utilize the locating rib 76 on the floor of the base portion for proper positioning and for securement of the cassette in the forward/rearward or axial direction. Conventionally these ribs are utilized for locating and stabilizing the positioning of wafer cassettes on equipment or in containers, but not for positioning cushions. Utilizing the rib for positioning the cushion and the cassette, particularly as in certain embodiments herein where the lower cushion is not secured or attached to the base portion, assures proper cooperation and alignment to prevent misalignment or cross slotting of wafers and the associated damage.

Referring to FIGS. 3 and 11-16, details of the upper cushion 38 and top cover portion 28 are illustrated. The upper cushion has a plurality of elongate wafer engaging segments 50 that are arcuate shaped to follow the periphery of the wafer and have at the segment end portions 130 springs 134 configured as U-shaped polymer springs that connect to support rails 140. The rails have inwardly extending recesses 144 that attach to tabs 148. The upper cushion, in certain embodiments, needs to be compressed in the directions indicated by arrows 160 in order to install the cushion on the top cover portion. Lateral rails 164 conveniently function as a handle as well as functioning as an ejector pad for ejection pins to eject the part from the mold during the injection molding process. Extending downwardly from the support rails 140 are wafer guides configured as prongs 170. The prongs are elongate and tapered and are the first part of the top cover encountered by the wafers when the top cover portion is lowered onto a cassette seated in a base portion. The prong has a length d1, measured in a radial direction, at least two times the depth of the V-shaped grooves 49 of the associated wafer segments 50. According to embodiments of the invention, when upper cushion 38 is secured to the inside of top cover portion 28, prongs or guides 170 of upper cushion 38 extend radially inward at least 5 mm from the peripheral edge of a 100 mm wafer seated in cassette 30, for example. The prong has a width dimension in a direction parallel to the elongate direction of the wafer segments that is at least twice the width of the prong in the normal direction transverse to the elongate direction of the wafer segments that is a multiplier of at least 2. In other embodiments the multiplier is at least 1.5; in other embodiments the multiplier is at least 2.5. The prongs are positioned to be intermediate each of the slots as defined by the teeth of the wafer cassette and also defined by the V-shaped grooves of the cushions. According to one embodiment, the maximum radial distance that the guides extend inwardly from edges of wafers held therein is within 20% of the maximum radial distance from the edges of the wafers that the teeth extend inwardly.

In use, the cassette is typically loaded with the open top rotated forwardly. The cassette then is rotated rearwardly to put the open top back on top. The cassette is lowered into the base portion with the lower cushion already in place in the base portion. As the base portion receives the loaded cassette, the lower peripheral edge 174 of the wafers engage the arcuate wafer engagement portions 56 on the lower cushion. The cushion is configured then to slight raise the wafers off of the lower edge portion 176 slightly to provide a gap 179 between the lower edge portion 176 and the wafer W when the cassette is seated in the base portion. In certain embodiments the gap might be a few thousandths of an inch. For example 0.005 inches to 0.020 inches. Or, 0.002 inches to 0.050 inches. The gap is substantially greater in the slot above the lower edge portion and the gap increases as the distance from the lower edge portion increases. Then the top portion 28 then is lowered over the cassette with the guides 170 interlaced inbetween the wafers as the top portion is lowered. When the top cover is fully engaged with the bottom cover, the upper cushion engages the top peripheral edge 183 of the wafers at the arcuate wafer engagement segments. The arcuate wafer engagement portions position the wafers spaced from the guides and further providing a gap at the outer non spring loaded portion or segment 185 of the cushion that is approximately the same as the gap between the lower edge portions of the slots and the wafers. In certain embodiments the gap might be a few thousandths of an inch. For example 0.005 inches to 0.020 inches. Or, 0.002 inches to 0.050 inches. The non spring loaded portion 185 is at the portion of the upper cushion that engages the attachment features of the inside of the top cover.

Figure 17:
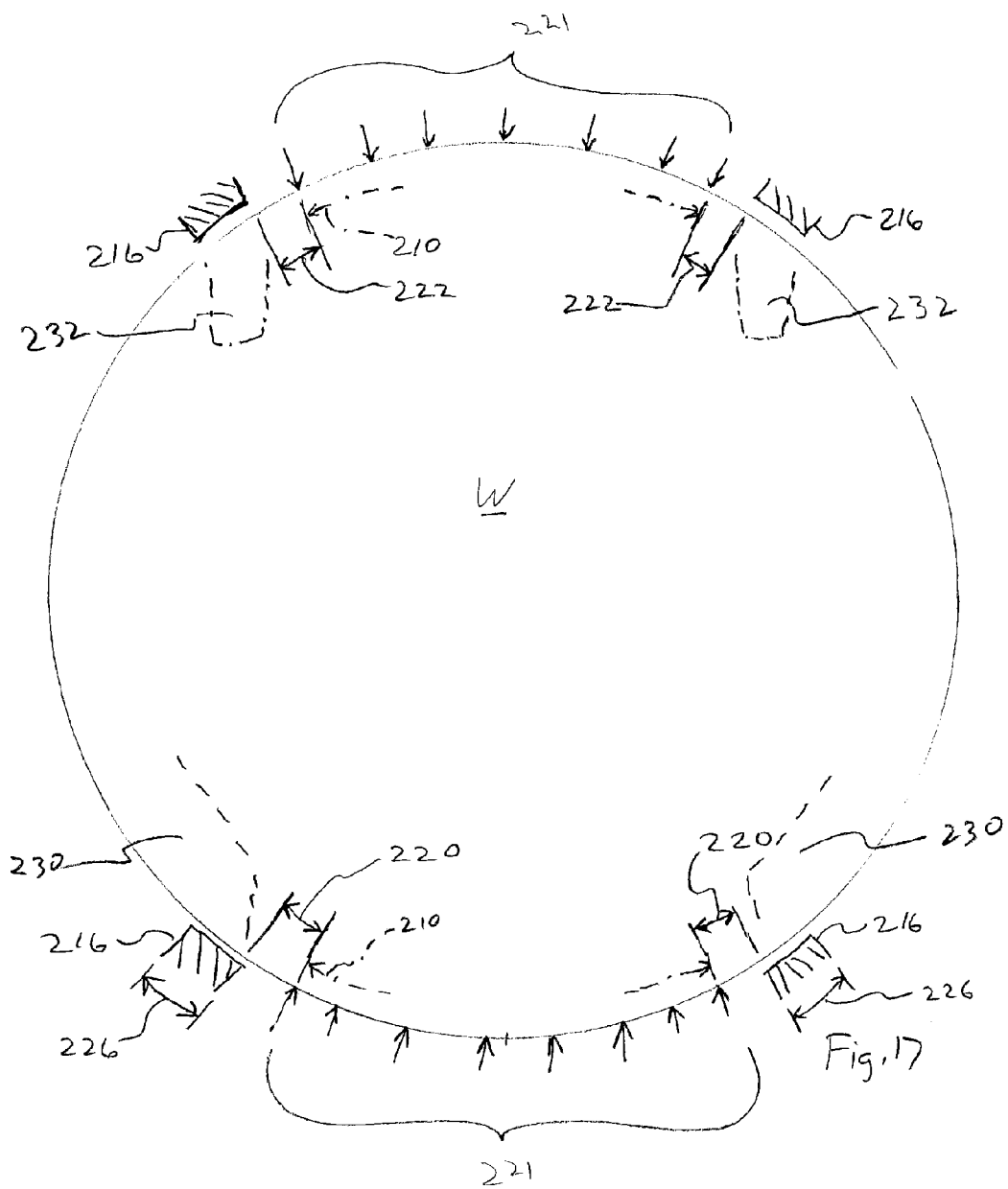
FIG. 17 is a schematic view of a wafer constrained by the inventions herein.

Referring to FIG. 17, in a fully loaded and closed state, the wafers are peripherally supported and suspended between arcuate portions of the upper cushion located at top dead center of the wafers and arcuate portions of the bottom cushion located at bottom dead center of the wafers. The arcuate engagement portions provide compressive force indicated by the arrows 221, and each extend around and engage the wafers over an arc 210 of approximately 55 degrees in one embodiment. In an embodiment the arcuate engagement portions each extend around and engage the wafers over an arc 210 of from 50 degrees to 60 degrees. Or about 49 degrees to about 61 degrees. In a shock condition further peripheral, more rigid peripheral support 216 is provided at positions spaced from the arcuate portions. At the lower periphery of the wafer, the more rigid support has a spacing 220 of about 5 degrees from the ends of the cushion and is provided by the lower edge portions of the grooves. At the upper peripheries of the wafers, the more rigid support has a spacing 222 of about 5 degrees from the ends of the cushions and provided by the non spring loaded portion of the upper cushion proximate the support rail of the cushion. The more rigid supports at both the upper peripheries of the wafers arc 226 along the wafer of from 4 degrees to 10 degrees or more. "Peripheral support" when used herein means support on the exterior peripheral surface of the wafer and/or on the peripheral portion of the corners between the opposing planar surfaces of the wafer, for example, the support provided by V-shaped grooves. Support extending over the surfaces of the wafers and directly intermediate the wafers which may be helpful in a axial shock condition is provided conventionally by the wafer teeth 230 as indicated by the portions outlined in dash lines, but is also now provided by the guides or prongs 232 in substantial vertical alignment and shown by dash dot lines.

Then in a shock condition, the wafers may move within the suspension provided by the arcuate suspended wafer engagement portions. During such motion, the lower edge portions 176 of the wafer slots may engage the outer non spring loaded portion of the 185 of the upper cushions. Moreover, further support is provided by the guides 170 that extend inbetween the wafers, generally precisely between the wafers. The guides provide a surface support on impact that is substantially a mirror image or similar to the surface support on impact provided by the teeth of the cassette. The further engagement of the wafers during shock conditions limit the amount of flexing of the brittle wafers. This mirror image surface support is provided and provides enhanced protection for thin wafers under greater loading than is provided in conventional shippers. "Surface" support herein means support provided at the periphery of the wafer by a surface that forms an angle with surface of the wafer of not more than 35 degrees.

Thus during non shock conditions the wafers are supported at arcs extending about 55 degrees at the top and bottoms of the wafers. Further, more rigid support under a shock condition is provided is provided peripherally Referring in particular to FIG. 3, a novel suspension is provided such that in a non impact condition, the wafer is supported by the lower cushion 34 at the arcuate wafer engagement portions 56. T The components herein are conventionally manufactures by injection molding. A suitable material is polypropylene. Other polymers will also be suitable.

Referring to the figures and particularly FIG. 3, a horizontally extending and continuous upper edge portion 190 of the base portion preferably extends upwardly to a level that is a distance of at least 25% of the height of the wafer cassette. Similarly, a lower continuous horizontal edge portion 192 of the top cover portion extends down to a level below the top of the cassette a distance that is at least 25% of the height of the cassette. The upper edge portion engages and latches to the cooperating lower horizontal edge portion 192 of the top cover. The edge portions mate to form a surface continuous around the periphery of the container portion with recesses 195 for operating the latches. The juncture 196 of the top cover to the bottom base portion extends entirely around the midsection 197 of the wafer cassette. The structures and features of similar containers are illustrated in U.S. Pat. Nos. 4,949,848; 4,966,284; 4,793,488; and 5,273,159 and such structures and features are suitable for use with the inventions described herein. These patents are owned by the owner of the instant invention and are all incorporated by reference herein. Notably the container portions described herein have only one side suitable for seating on a horizontal surface. That is they do not have seating features on adjacent sides like H-bar cassettes and certain containers know as FOSBs (front opening shipping boxes) that are utilized typically for larger diameter wafers, specifically 300 mm or larger. In embodiments of the invention, each of the top cover portion and base portion have a height, and the height of each is within 25% of the height of the other.

When "substantially" is utilized herein with reference to a dimension or distance, it means within 15% of the compared to dimension.

The embodiments above are intended to be illustrative and not limiting. Additional embodiments are within the claims. Although the present invention has been described with reference to particular embodiments, workers skilled in the art will recognize that changes may be made in form and detail without departing from the spirit and scope of the invention.

What is claimed is:

1. A wafer shipper comprising a cassette and a cassette container and configured for holding thin wafers, the cassette comprising a pair of sidewalls defining slots for holding wafers, a pair of endwalls extending between the sidewalls, one of the endwalls configured as an H-bar machine interface, and pair of elongate feet extending downwardly from the respective sidewalls;

the cassette container comprising a bottom base portion for receiving the cassette therein, and a top cover attachable to the bottom base portion, each of the top cover and base portion having four walls and a common wall spanning between the four walls, each of the top cover and base portion having a juncture for closing the top cover to the base portion, the cassette container further comprising an upper cushion attachable to the top cover and a lower cushion that seats in a receiving region in the bottom base portion;

wherein the upper cushion is secured to the inside of the top cover and the upper cushion has a pair of rails that attach to the top cover, and that support a plurality of wafer engaging segments, the wafer engaging segments connecting to the pair of rails by way of a respective pair of U-shaped springs formed of the same material as the wafer engaging segments, the upper cushion further comprising a plurality of guides extending radially inward for placement in between wafers secured by the wafer engaging segments.

2. The wafer shipper of claim 1 wherein the base portion has a locator rib extending from a floor of the base portion, and wherein at least one of the cassette feet has a lower edge portion, the lower edge portion having a notch positioned to seat on the locator rib when the cassette is placed in the bottom base portion, and wherein the lower cushion has a pair of rails with wafer engagement portions extending therebetween, the rails each having a lower edge portion and at least one of said lower edge portions of the rails having a centrally positioned notch positioned to also seat on the locating rib.

3. The wafer shipper of claim 1 wherein the lower cushion comprises a pair of rails supporting a plurality of wafer engagement portions, and wherein the lower cushion further comprises a plurality of pads extending laterally out from the pair of rails, and wherein the lower cushion seats on a floor of the base portion by way of the plurality of pads.

4. The wafer shipper of claim 3 wherein each of the pads has a top surface and when the cassette is positioned in the base portion the feet of the cassette seat on top of the pads whereby the pads are sandwiched between the base portion floor and the cassette.

5. The wafer shipper of claim 1 wherein the upper cushion is secured to the inside of the top cover and the guides of the upper cushion are configured as prongs that extend radially inward at least 5 mm from the peripheral edge of a 100 mm wafer seated in the cassette.

6. The wafer shipper of claim 1 wherein the lower cushion is secured to the inside of the bottom base portion and the lower cushion has a pair of rails that support a plurality of wafer engagement portions.

7. The wafer shipper of claim 1 wherein the upper cushion has V-shaped grooves for receiving the periphery of the wafers, the V-shaped grooves defining wafer slots, the guides of the upper cushion configured as a plurality of prongs each positioned intermediate the slots defined by the V-shaped grooves.

8. The wafer shipper of claim 1 wherein the wafer engaging segments each have a V-shaped groove with a maximum depth, the V-shaped grooves for receiving the periphery of the wafers, the guides of the upper cushion configured as a plurality of prongs each positioned intermediate slots defined by the V-shaped grooves and positioned to be the first part of the upper cushion to confront the wafers when the top cover is installed on a base portion with a cassette loaded with wafers therein.

9. The wafer shipper of claim 8 wherein each of the prongs extends radially inward from the periphery of the wafer when the top cover is fully seated on the bottom base portion, a distance at least twice the maximum depth of the V-shaped grooves.

10. The wafer shipper of claim 1 wherein the lower cushion seats in the bottom base portion and is constrained from vertically upward linear movement only by gravity when the cassette is not seated.

11. The wafer shipper of claim 1 wherein each of the components are formed of polypropylene.

12. A wafer shipper comprising a cassette and a cassette container, the cassette comprising a pair of sidewalls defining slots for holding wafers having a circular periphery, a pair of endwalls extending between the sidewalls, one of the endwalls configured as an H-bar machine interface, and pair of elongate feet extending downwardly from the respective sidewalls;

the cassette container comprising a bottom base portion for receiving the cassette therein, and a top cover attachable to the bottom base portion, each of the top cover and base portion having four walls and a common wall spanning between the four walls, each of the top cover and base portion having a juncture for closing the top cover to the base portion, the cassette container further comprising an upper cushion attachable to the top cover and a lower cushion received in the bottom base portion, the upper cushion being secured to the inside of the top cover and the upper cushion has a pair of rails that attach to the top cover and that support a plurality of wafer engaging segments, each wafer engaging segment traversing between the two rails and having a length and having a V-shaped groove with a depth, the V-shaped groove extending the length of the segment, the upper cushion further having a plurality of guides positioned proximate ends of the wafer engaging segments, the guides extending radially inward for placement in between wafers secured by the wafer engaging segments, the guides being spaced circumferentially along the wafers from the wafer engaging segments and having a length in a radial direction with respect to wafers in the container that is at least 2 times the depth of the V-shaped grooves, the guides providing a surface for the wafers in a shock condition.

13. A wafer shipper comprising a cassette and a cassette container, the cassette comprising a pair of sidewalls defining slots for holding wafers, a pair of endwalls extending between the sidewalls, one of the endwalls configured as an H-bar machine interface, and pair of elongate feet extending downwardly from the respective sidewalls;

the cassette container comprising a bottom base portion for receiving the cassette therein, and a top cover attachable to bottom base portion, each of the top cover and base portion having four walls and a common wall spanning between the four walls, each of the top cover and base portion having a juncture for closing the top cover to the base portion, the cassette container further comprising an upper cushion attachable to the top cover and a lower cushion received in the bottom base portion, the upper cushion being secured to the inside of the top cover and the upper cushion has a pair of rails that attach to the top cover and that support a plurality of wafer engaging segments extending therefrom, the wafer engaging segments each having a V-shaped groove, the upper cushion further comprising a plurality of tapered guides, each with a tip, extending downwardly from the rails and in radial alignment with a location where the rails attach to the top cover, the tapered guides each positioned such that tips of the guides move past the periphery of the wafers before the wafer peripheries enter the V-shaped grooves and such that the tapered guides are closer, along the circumference of the wafers, to the sidewalls of the cassette than the V-shaped grooves are to the sidewalls of the cassette, wherein the tapered guides are each positioned intermediate the slots and positioned to be the first part of the upper cushion to confront the wafers when the top cover is installed on a base portion with a cassette loaded with wafers therein.

14. A wafer shipper comprising a cassette and a cassette container, the cassette comprising a pair of sidewalls defining slots for holding wafers, a pair of endwalls extending between the sidewalls, one of the endwalls configured as an H-bar machine interface, and pair of elongate feet extending downwardly from the respective sidewalls;

the cassette container comprising a bottom base portion for receiving the cassette therein, and a top cover attachable to the bottom base portion, each of the top cover and base portion having four walls and a common wall spanning between the four walls, each of the top cover and base portion having a juncture for closing the top cover to the base portion, the cassette container further comprising an upper cushion attachable to the top cover and a lower cushion received in the bottom base portion, wherein the upper cushion has rails that support a plurality of wafer engaging segments, the wafer engaging segments connecting to the rails by U-shaped springs, and wherein the lower cushion comprises a pair of rails supporting a plurality of wafer engagement portions, and wherein the lower cushion further comprises a plurality of pads extending laterally out from the pair of lower cushion rails, and wherein the lower cushion seats on a floor of the base portion by way of the plurality of pads and each of the pads has a top surface and when the cassette is positioned in the base portion, the feet of the cassette seat on top of the pads whereby the pads are sandwiched between the base portion floor and the cassette, further wherein the lower cushion seats in the base portion and is constrained from vertically upward linear movement only by gravity when the cassette is not seated.

15. A wafer cushion for placement at the open top of an H-bar wafer cassette, the cushion having a plurality of separate and end supported arcuate wafer engaging segments each having a V-shaped groove, a U-shaped spring extending from each end of each wafer engaging segment, each U-shaped spring connecting to a rail portion, the rail portion providing a rigid arcuate wafer engagement surface that is radially spaced outward from the respective arcuate wafer engaging segments, each rail further having a plurality of prongs extending radially inward for placement inbetween wafers secured by the wafer engaging segments.

16. A wafer shipper having an H-bar wafer cassette with an open top and opposing sidewalls, the sidewalls connected by opposing end walls, each sidewall having a vertical upper portion and a converging lower portion, interior surfaces of the sidewalls defining a plurality of teeth with slots therebetween for holding axially aligned wafers, a cushion for placement at the open top of the H-bar wafer cassette, the cushion having a pair of rails for attaching to a top cover of the wafer shipper, the pair of rails supporting a plurality of arcuate wafer engaging segments each having a V-shaped groove, each V-shaped groove having a height measured in a radial direction, the cushion further having a plurality of guides positioned proximate ends of the wafer engaging segments, the guides extending radially inward for placement in vertical alignment with the teeth of the cassette and the guides positioned to be spaced circumferentially along the wafers from the V-shaped grooves and in radial alignment with a location where the rails attach to the top cover.

17. The wafer shipper of claim 16 wherein the guides extend inwardly a maximum radial distance from edges of wafers held therein and wherein the teeth extend inwardly a maximum radial distance from the edges of the wafers held therein that is substantially the same as the maximum radial distance that the guides extend inwardly from the edges of the wafers.

18. The wafer shipper of claim 17, wherein the maximum radial distance that the guides extend inwardly from edges of wafers held therein is within 20% of the maximum radial distance from the edges of the wafers that the teeth extend inwardly.

19. The wafer shipper of claim 16, wherein each of the teeth have a most lower portion and the guides are in vertical alignment with the most lower portion of the teeth.

20. A wafer shipper comprising a cassette and a cassette container and configured for holding thin wafers,
the cassette comprising a pair of sidewalls defining slots for holding wafers, a pair of endwalls extending between the sidewalls, one of the endwalls configured as an H-bar machine interface, and pair of elongate feet extending downwardly from the respective sidewalls;
the cassette container comprising a bottom base portion for receiving the cassette therein, and a top cover attachable to the bottom base portion, each of the top cover and base portion having four walls and a common wall spanning between the four walls, each of the top cover and base portion having a juncture for closing the top cover to the base portion, the cassette container further comprising an upper cushion attachable to the top cover and a lower cushion that seats in a receiving region in the bottom base portion;
wherein the upper cushion is secured to the inside of the top cover and the upper cushion has a pair of rails that attach to the top cover, and that support a plurality of wafer engaging segments, the wafer engaging segments connecting to the pair of rails by way of a respective pair of U-shaped springs formed of the same material as the wafer engaging segments;
wherein the wafer engaging segments each have a V-shaped groove with a maximum depth, the V-shaped grooves for receiving the periphery of the wafers, the upper cushion having a plurality of prongs each positioned intermediate the slots and positioned to be the first part of the upper cushion to confront the wafers when the top cover is installed on a base portion with a cassette loaded with wafers therein.

21. A wafer shipper comprising a cassette and a cassette container and configured for holding thin wafers,
the cassette comprising a pair of sidewalls defining slots for holding wafers, a pair of endwalls extending between the sidewalls, one of the endwalls configured as an H-bar machine interface, and pair of elongate feet extending downwardly from the respective sidewalls;
the cassette container comprising a bottom base portion for receiving the cassette therein, and a top cover attachable to the bottom base portion, each of the top cover and base portion having four walls and a common wall spanning between the four walls, each of the top cover and base portion having a juncture for closing the top cover to the base portion, the cassette container further comprising an upper cushion attachable to the top cover and a lower cushion that seats in a receiving region in the bottom base portion;
wherein the base portion has a locator rib extending from a floor of the base portion, and wherein at least one of the cassette feet has a lower edge portion, the lower edge portion having a notch positioned to seat on the locator rib when the cassette is placed in the bottom base portion, and wherein the lower cushion has a pair of rails with wafer engagement portions extending therebetween, the rails each having a lower edge portion and at least one of said lower edge portions of the rails having a centrally positioned notch positioned to also seat on the locating rib.

22. The wafer shipper of claim 21, wherein the upper cushion is secured to the inside of the top cover and the upper cushion has a pair of rails that attach to the top cover, and that support a plurality of wafer engaging segments, the wafer engaging segments connecting to the pair of rails by way of a respective pair of U-shaped springs formed of the same material as the wafer engaging segments.

23. A wafer shipper comprising a cassette and a cassette container and configured for holding thin wafers,
the cassette comprising a pair of sidewalls defining slots for holding wafers, a pair of endwalls extending between the sidewalls, one of the endwalls configured as an H-bar machine interface, and pair of elongate feet extending downwardly from the respective sidewalls;
the cassette container comprising a bottom base portion for receiving the cassette therein, and a top cover attachable to the bottom base portion, each of the top cover and base portion having four walls and a common wall spanning between the four walls, each of the top cover and base portion having a juncture for closing the top cover to the base portion, the cassette container further comprising an upper cushion attachable to the top cover and a lower cushion that seats in a receiving region in the bottom base portion;
wherein the lower cushion seats in the bottom base portion and is constrained from vertically upward linear movement only by gravity when the cassette is not seated in the bottom base portion;
further wherein the lower cushion comprises a plurality of pads sandwiched between the bottom base portion and the feet of the cassette when the cassette is seated in the bottom base portion.

24. The wafer shipper of claim 23, wherein the upper cushion is secured to the inside of the top cover and the upper cushion has a pair of rails that attach to the top cover, and that support a plurality of wafer engaging segments, the wafer engaging segments connecting to the pair of rails by way of a respective pair of U-shaped springs formed of the same material as the wafer engaging segments.

25. A wafer shipper having a cassette with opposing sidewalls, the sidewalls connected by opposing end walls, each sidewall having a vertical upper portion and a converging lower portion, interior surfaces of the sidewalls defining a plurality of teeth with slots therebetween for holding axially aligned wafers,
a cushion for placement at an open top of the wafer cassette, the cushion having a pair of rails for attaching to a top cover of the wafer shipper, the pair of rails supporting a plurality of arcuate wafer engaging segments each having a groove, each groove having a height measured in a radial direction, the cushion further having a plurality of guides positioned proximate ends of the wafer engaging segments, the guides in radial alignment with a location where the rails attach to the top cover and the guides extending radially inward for placement in between wafers secured by the wafer engaging segments, the guides each being closer, along the circumference of the wafers, to the sidewalls of the cassette than the grooves are to the sidewalls of the cassette.

* * * * *